(12) United States Patent
Xiang et al.

(10) Patent No.: US 6,448,127 B1
(45) Date of Patent: Sep. 10, 2002

(54) PROCESS FOR FORMATION OF ULTRA-THIN BASE OXIDE IN HIGH K/ OXIDE STACK GATE DIELECTRICS OF MOSFETS

(75) Inventors: Qi Xiang, Santa Clara; Joong Jeon, Cupertino; Colman Wong, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/740,606

(22) Filed: Dec. 19, 2000

Related U.S. Application Data
(60) Provisional application No. 60/176,371, filed on Jan. 14, 2000.

(51) Int. Cl.$^7$ .......................................... H01L 21/8238
(52) U.S. Cl. .................... 438/216; 438/287; 438/585; 438/591; 438/723; 438/976; 438/981
(58) Field of Search .............................. 438/216, 199, 438/261, 263, 264, 279, 287, 443, 585, 591, 594, 706, 723, 976, 981

(56) References Cited

U.S. PATENT DOCUMENTS

| | | | | |
|---|---|---|---|---|
| 5,738,909 A | * | 4/1998 | Thakur et al. | 427/255.4 |
| 5,972,804 A | * | 10/1999 | Tobin et al. | 438/786 |
| 6,171,911 B1 | * | 1/2001 | Yu | 438/275 |
| 6,020,024 A1 | * | 2/2001 | Maiti et al. | 438/287 |

* cited by examiner

*Primary Examiner*—Chandra Chaudhari
*Assistant Examiner*—Jack Chen
(74) *Attorney, Agent, or Firm*—Foley & Lardner

(57) ABSTRACT

A method and article of manufacture of an ultra-thin base oxide or nitrided oxide layer in a CMOS device. The method and article of manufacture are formed by providing a silicon wafer with an initial oxide layer which is removed from the silicon wafer by a hydrogen baking step. A new oxide layer or nitrided oxide layer is formed by thermal growth on the silicon wafer surface. A portion of the new oxide layer is removed by hydrogen annealing. A MOSFET can be created by forming a gate electrode structure on a high-k dielectric material deposited on the new oxide layer.

19 Claims, 2 Drawing Sheets

PROCESS FOR FORMATION OF ULTRA-THIN BASE OXIDE IN HIGH K/ OXIDE STACK GATE DIELECTRICS OF MOSFETS

CROSS REFERENCE TO RELATED APPLICATIONS

This application claims the benefits of U.S. Provisional Application No. 60/176,371, filed Jan. 14, 2000.

TECHNICAL FIELD

This invention is related to an improved structure for an integrated circuit. In particular, the invention is related to a method and article of manufacture for a deep submicon complementary metal oxide semiconductor (CMOS) integrated circuit. Further, the invention involves a method for creating an ultra-thin base oxide layer for a high-k/oxide stack gate dielectric.

BACKGROUND OF THE INVENTION

A principal emphasis of current semiconductor device technology is directed to ultra-large scale integrated circuits in which CMOS structures are an important component. The needs of the microelectronics industry have forced evolution to smaller devices and thinner layers of materials for meeting performance requirements of the devices. As a consequence of these requirements, the gate oxide component is approaching dimensions which will enable direct carrier tunneling to take place, causing high leakage currents to occur in the CMOS-based devices. It is in the consensus in the industry that $SiO_2$ gate oxide thickness can only be reduced to about 15 Ångstroms (Å). For the next generation of devices, it is therefore expected that a gate dielectric material must have thickness smaller than 15 Å in equivalent oxide thickness (EOT).

SUMMARY OF THE INVENTION

Solutions to the problem of ultra-thin gate dielectrics are directed in this invention generally to use of a stack of high dielectric constant (k) dielectric and an oxide which will be used to replace the single layer of $SiO_2$. A base oxide in a high-k/oxide stack can serve to form a buffer layer to preserve the desirable properties of an $SiO_2$/Si interface and also prevent reaction between the Si and the high-k material in the stack. Consequently, an ultra-thin buffer oxide layer (about 5 Å thickness) can provide a solution to the problem of achieving an equivalent oxide thickness less than 15 Å. The instant invention includes forming an ultra-thin base oxide by a method of initially removing native oxide of $SiO_2$ from a Si substrate by subjecting the device to a hydrogen baking step, followed by thermal growth of a controlled thickness of oxide and then reducing the base oxide thickness to about 5 Å by a post hydrogen anneal.

These and other objects, features and advantages of the invention will be apparent from the following description of the preferred embodiments and examples, taken in conjunction with the accompanying drawings described below.

DETAILED DESCRIPTION OF PREFERRED EMBODIMENTS

Figure 1:
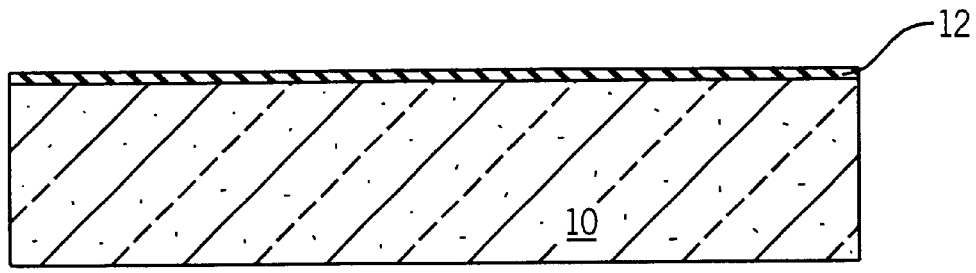
FIG. 1 illustrates a silicon substrate wafer with a native oxide layer on top of the silicon wafer.
Figure 2:
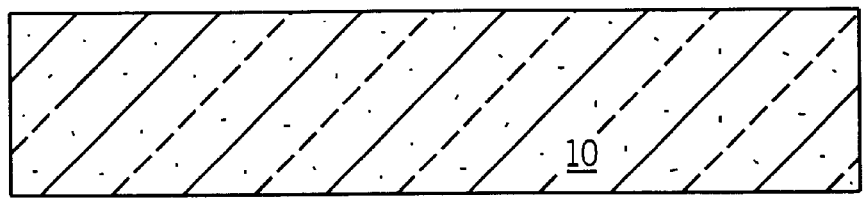
FIG. 2 illustrates the silicon wafer of FIG. 1 after the native oxide is removed by hydrogen baking.

A method and article of manufacture of the invention are illustrated by reference to FIGS. 1–6. In order to achieve a desired stack of high-k/oxide in a CMOS device, it is preferable to start with an Si wafer 10 which is cleaned before performing the step of creating a gate dielectric. As shown in FIG. 1, the Si wafer 10 can be cleaned such that only a thin native oxide layer 12 remains on the Si wafer. This native oxide layer 12 is typically several Ångstroms thick; and as shown in FIG. 2, the layer 12 can be removed by hydrogen baking to obtain a clean form of the Si wafer 10. The hydrogen baking step is a conventional method to remove the vative oxide layer 12 on the Si wafer 10. The reaction in this step is $SiO_2+H_2=SiO\uparrow+H_2O\uparrow$. The rate of $SiO_2$ removal can be controlled most readily by the baking temperature of the native oxide layer 12.

Figure 3:
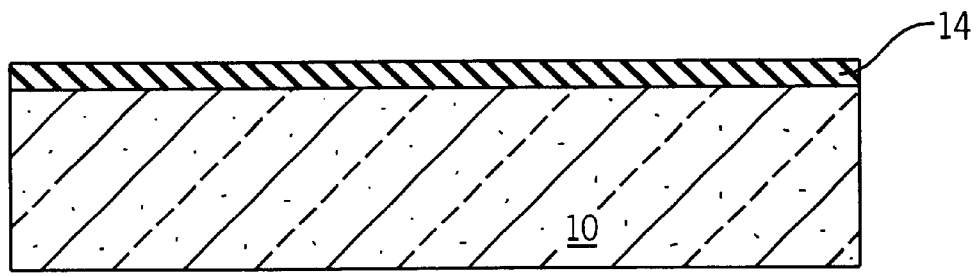
FIG. 3 illustrates a base oxide or nitride oxide layer on the silicon wafer of FIG. 2.

After removal of the native oxide layer 12, a base oxide or nitrided oxide layer 14 can be formed on the Si wafer 10 as shown in FIG. 3. The base oxide or nitrided oxide form of the layer 14 can be prepared by thermally growing about 12 Å of oxide or nitrided oxide.

Figure 4:
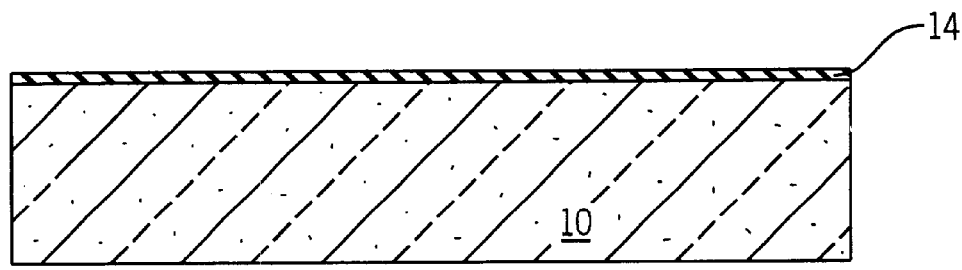
FIG. 4 illustrates the structure of FIG. 3 but the oxide layer has been reduced in thickness by a hydrogen anneal.

Once the base oxide or nitrided oxide layer 14 is established, the thickness can be controllably reduced to about 5 Å by a post hydrogen anneal, as shown in FIG. 4. This step allows very precise control of the rate of removal of the layer 14 and results in a uniform thickness for the layer 14.

Figure 5:
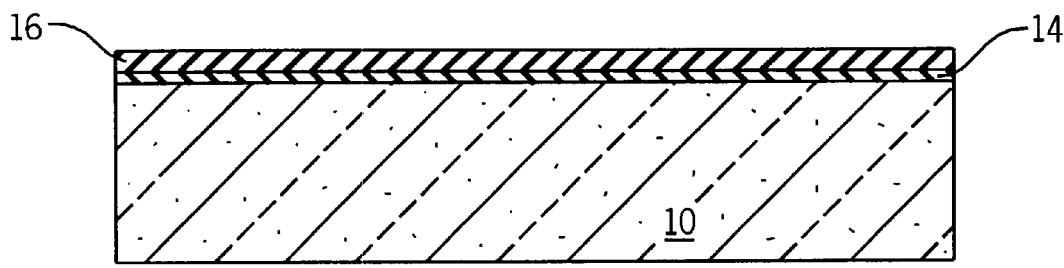
FIG. 5 illustrates the structure of FIG. 4 with an added overlayer of a high-k dielectric material layer.

After the base oxide or nitrided oxide layer 14 is established as a thin uniform layer (about 4–10 Å thickness), a high-k dielectric material layer 16 can be deposited on top of the base oxide or nitrided oxide layer 14 (see FIG. 5). This can be accomplished by any one of a number of conventional methodologies, such as for example, sputtering and chemical vapor deposition.

Figure 6:
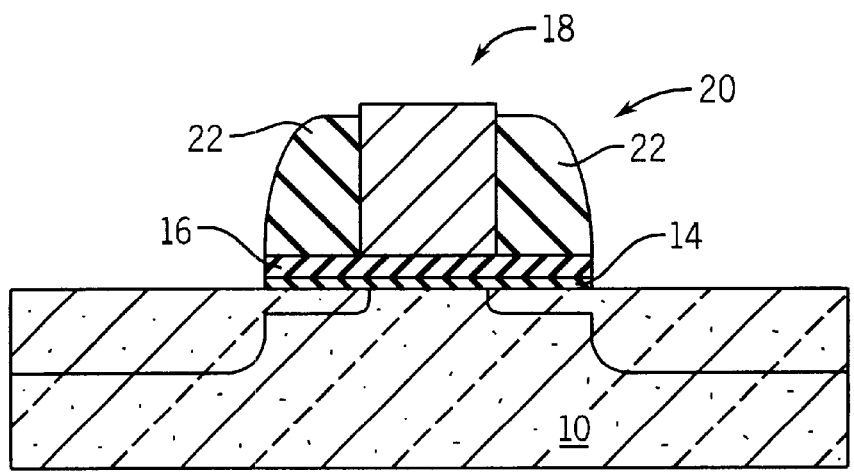
FIG. 6 illustrates a MOSFET structure with a stack form of high-k oxide gate dielectric.

A stack of layers 18 is now in place (see FIG. 5), and this basic layer structure can be adapted and modified to be fabricated into a MOSFET structure 20, as shown in FIG. 6. As can be noted, the structure 20 includes the Si wafer 10, the base oxide or nitride oxide layer 14 with the high-k dielectric material layer 16 disposed on the layer 14. A gate electrode structure 20 is then deposited on top of the high-k dielectric material layer 16 with an adjacent $SiO_2$ or SiN spacer component 22. This gate electrode structure 20 can be formed by a conventional methodology.

The above non-limiting examples illustrate several preferred embodiments of the method and article of manufacture of the invention.

While preferred embodiments have been illustrated and described, it should be understood that changes and modifications can be made therein in accordance with one of ordinary skill in the art without departing from the invention in its broader aspects. Various features of the invention are defined in the following claims.

What is claimed is:

1. A method of manufacturing an ultra-thin base oxide layer in a CMOS device, comprising the steps of:

providing a silicon wafer having an initial oxide layer disposed thereon;

removing the initial oxide layer on the silicon wafer by hydrogen baking to form a cleaned silicon wafer surface;

forming a new oxide layer by thermal oxide growth on the cleaned silicon wafer surface; and removing a portion of thickness of the new oxide layer by hydrogen annealing the new oxide layer disposed on the cleaned silicon wafer surface.

2. The method as defined in claim 1 wherein the initial oxide layer comprises a native oxide.

3. The method as defined in claim 1 wherein the new oxide layer comprises an oxide selected from a group consisting of a base oxide and a nitrided oxide.

4. The method as defined in claim 3 wherein the new oxide layer has a thickness of at least about 8 Å.

5. The method as defined in claim 4 wherein the new oxide layer has a thickness of at least about 10 Å.

6. The method as defined in claim 5 wherein the new oxide layer has a thickness of about 10–12 Å.

7. The method as defined in claim 1 wherein the step of hydrogen annealing is continued until the thickness of the new oxide layer is reduced to about 5 Å.

8. The method as defined in claim 1 further including the step of forming a high-k dielectric material layer on the new oxide layer.

9. The method as defined in claim 8 further including the step of forming a gate electrode structure on the high-k dielectric material layer, thereby forming a MOSFET component.

10. The method as defined in claim 1 wherein the hydrogen annealing uses $H_2$.

11. A method of manufacturing an integrated circuit including a substrate having a substantially uncontaminated Si surface, an ultra-thin layer of about 5–15 Å of oxide disposed on the uncontaminated Si surface of the substrate and a high-k dielectric material layer disposed on the ultra-thin layer, the method comprising steps of in the following order:

providing a silicon wafer having an initial oxide layer disposed thereon;

removing the initial oxide layer on the silicon wafer by hydrogen baking to form a cleaned surface;

forming a new oxide layer by thermal oxide growth on the cleaned surface; and removing a portion of thickness of the new oxide layer by hydrogen annealing the new oxide layer disposed on the silicon wafer surface.

12. The method as defined in claim 11 wherein the ultra-thin layer of oxide is selected from the group consisting of a base oxide and a nitrided oxide.

13. The method as defined in claim 11 wherein the ultra-thin layer of oxide has a thickness of about 4–8 Å.

14. The method as defined in claim 11 wherein the hydrogen baking step and hydrogen annealing utilize $H_2$.

15. A method of manufacturing an ultra-thin base oxide layer in a CMOS device, the method comprising:

providing a silicon wafer having an initial oxide layer disposed thereon;

removing the initial oxide layer on the silicon wafer by hydrogen baking to form a cleaned silicon wafer surface;

providing a nitrided oxide layer by thermal oxide growth on the cleaned silicon wafer surface; and removing a portion of thickness of the nitrided oxide layer by hydrogen annealing the nitrided oxide layer disposed on the cleaned silicon wafer surface.

16. The method as defined in claim 15 wherein the initial oxide layer comprises a native oxide.

17. The method as defined in claim 15 wherein the nitrided oxide layer comprises thermally grown nitrided oxide.

18. The method as defined in claim 17 wherein the nitrided oxide layer has a thickness of at least about 8 Å.

19. The method as defined in claim 18 wherein the nitrided oxide layer has a thickness of at least about 10 Å.

* * * * *